United States Patent
Leobandung et al.

(10) Patent No.: US 9,711,648 B1
(45) Date of Patent: Jul. 18, 2017

(54) STRUCTURE AND METHOD FOR CMP-FREE III-V ISOLATION

(71) Applicant: GLOBALFOUNDRIES INC., Grand Cayman (KY)

(72) Inventors: Effendi Leobandung, Stormville, NY (US); Chung-Hsun Lin, White Plains, NY (US); Amlan Majumdar, White Plains, NY (US); Yanning Sun, Scarsdale, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/232,164

(22) Filed: Aug. 9, 2016

(51) Int. Cl.
*H01L 29/786* (2006.01)
*H01L 29/66* (2006.01)
*H01L 29/78* (2006.01)

(52) U.S. Cl.
CPC .. *H01L 29/78603* (2013.01); *H01L 29/66522* (2013.01); *H01L 29/66651* (2013.01); *H01L 29/66795* (2013.01); *H01L 29/785* (2013.01); *H01L 29/78681* (2013.01); *H01L 29/78696* (2013.01)

(58) Field of Classification Search
CPC ......... H01L 29/78603; H01L 29/66522; H01L 29/6651; H01L 29/66795; H01L 29/785; H01L 29/78681; H01L 29/78696
See application file for complete search history.

(56) References Cited

U.S. PATENT DOCUMENTS

| | | | |
|---|---|---|---|
| 9,425,257 B2 * | 8/2016 | Fung | H01L 29/785 |
| 2013/0161705 A1 * | 6/2013 | Disney | H01L 29/66446 257/263 |
| 2015/0200267 A1 * | 7/2015 | Ching | H01L 29/6656 257/401 |
| 2015/0380557 A1 * | 12/2015 | Le | H01L 29/42392 257/190 |
| 2016/0020317 A1 * | 1/2016 | Rachmady | B82Y 10/00 257/24 |
| 2016/0322477 A1 * | 11/2016 | Huang | H01L 29/785 |

* cited by examiner

*Primary Examiner* — Christine Enad
(74) *Attorney, Agent, or Firm* — Scully Scott Murphy and Presser; Frank Digiglio

(57) ABSTRACT

A semiconductor structure is provided that includes a channel material portion composed of a III-V compound semiconductor located on a mesa portion of a substrate. A dielectric spacer structure is located on each sidewall surface of the channel material portion and each sidewall surface of the mesa portion of the substrate. The dielectric spacer structure has a height that is greater than a height of the channel material portion. An isolation structure is located on each dielectric spacer structure, wherein a sidewall edge of the isolation structure is located between an innermost sidewall surface and an outermost sidewall surface of the dielectric spacer structure.

16 Claims, 5 Drawing Sheets

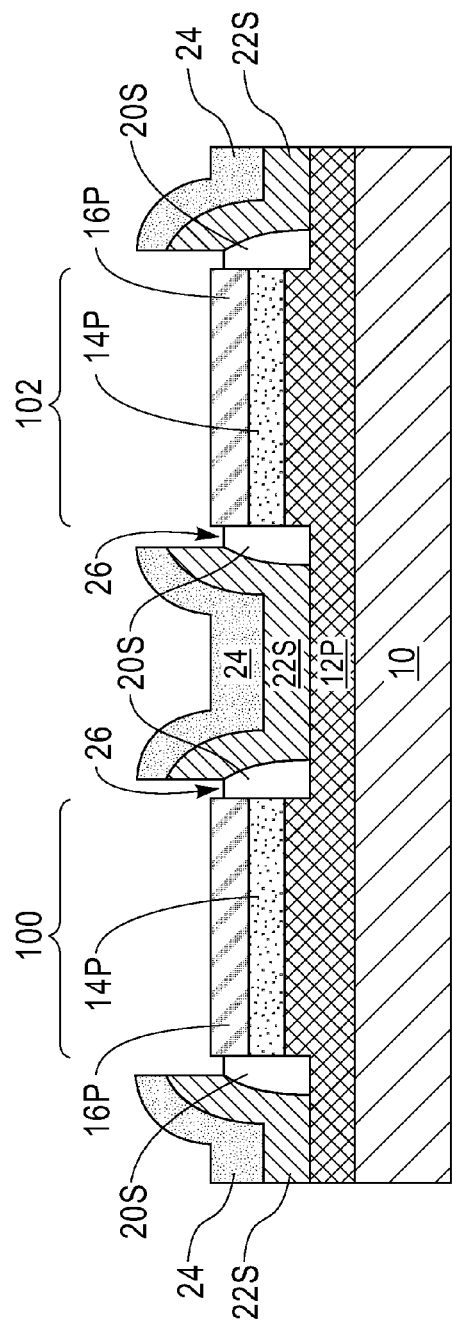
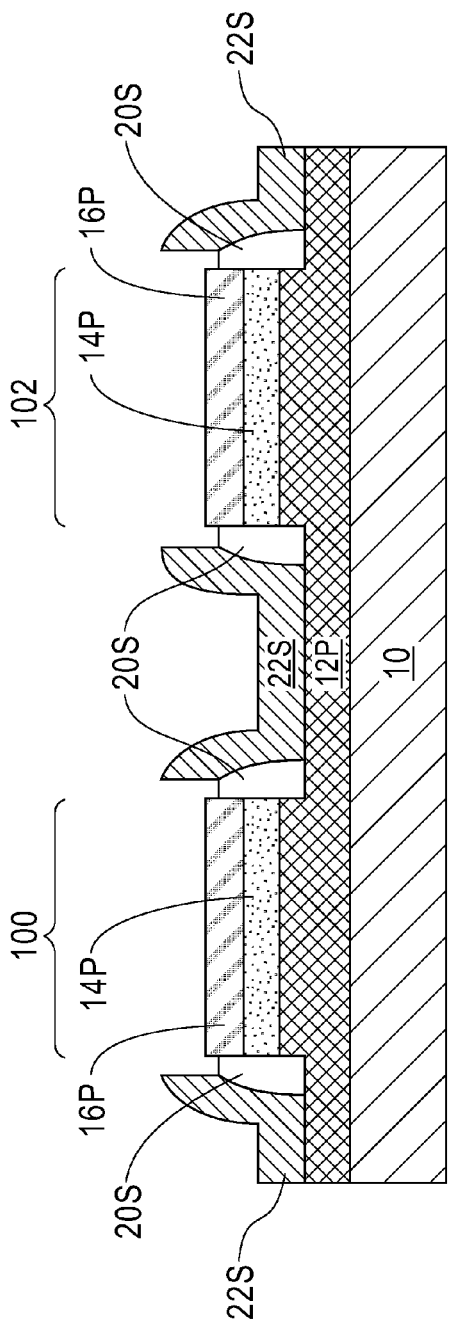
FIG. 7
FIG. 8

STRUCTURE AND METHOD FOR CMP-FREE III-V ISOLATION

BACKGROUND

The present application relates to a semiconductor structure and a method of forming the same. More particularly, the present application relates to a semiconductor structure containing an isolation structure for use in isolating III-V compound semiconductor field effect transistors (FETs), and a method of forming such a semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits.

Since it has become increasingly difficult to improve MOSFETs and therefore complementary metal oxide semiconductor (CMOS) performance through continued scaling, further methods for improving performance in addition to scaling have become critical. In some applications, improved performance can be achieved by replacing a silicon channel with a high carrier mobility semiconductor material. One promising class of high carrier mobility semiconductor materials that have received considerable interest as a replacement semiconductor material for silicon is III-V compound semiconductor materials.

Although III-V compound semiconductor based FETs can achieve a higher performance than their silicon counterparts, a problem exists in forming an isolation structure using III-V compound semiconductors. Notably, the processes used to form isolation structures employed in silicon based technologies are not compatible with III-V based semiconductor devices. For example, field oxide isolation structures are formed using a high temperature oxidation process which cannot be performed with III-V compound semiconductors. Moreover, shallow trench isolation structures require the use of a chemical mechanical planarization (CMP) process which is presently difficult to perform with III-V compound semiconductors. Mesa isolation structures are also possible but such isolation structures require the use of semiconductor-on-insulator substrates or semi-insulator materials, and cannot be performed using doped semiconductors.

In view of the above, there is a need for providing a semiconductor structure containing an isolation structure for use in isolating III-V compound semiconductor FETs that avoids the problems and drawbacks associated with using existing isolation structures.

SUMMARY

In one aspect of the present application, a semiconductor structure is provided. In one embodiment of the present application, the semiconductor structure includes a channel material portion composed of a III-V compound semiconductor located on a mesa portion of a substrate. The structure further includes a dielectric spacer structure located on each sidewall surface of the channel material portion and each sidewall surface of the mesa portion of the substrate. The dielectric spacer structure has a height that is greater than a height of the channel material portion. The structure further includes an isolation structure located on each dielectric spacer structure, wherein a sidewall edge of the isolation structure is located between an innermost sidewall surface and an outermost sidewall surface of the dielectric spacer structure.

In another aspect of the present application, a method of forming a semiconductor structure is provided. In one embodiment of the present application, the method may include forming at least one active area on a surface of a substrate. Each active area comprises a material stack of a mesa portion of the substrate, a channel material portion of a III-V compound semiconductor material, and a hard mask material portion. Next, a dielectric spacer is formed on each exposed sidewall surface of the material stack. An isolation dielectric material layer is then formed on the dielectric spacer and on the at least one active area. Next, the isolation dielectric material layer and the dielectric spacer are patterned, wherein a remaining portion of the isolation dielectric material layer forms an isolation structure on a remaining portion of the dielectric spacer, and wherein a sidewall edge of the isolation structure is located between an innermost sidewall surface and an outermost sidewall surface of the remaining portion of the dielectric spacer. The hard mask material portion is thereafter removed.

BRIEF DESCRIPTION OF SEVERAL VIEWS OF THE DRAWINGS

FIG. 7 is a cross sectional view of the exemplary semiconductor structure of FIG. 6 after performing an etch.

FIG. 8 is a cross sectional view of the exemplary semiconductor structure of FIG. 7 after removing the patterned photoresist.

DETAILED DESCRIPTION

Figure 1:
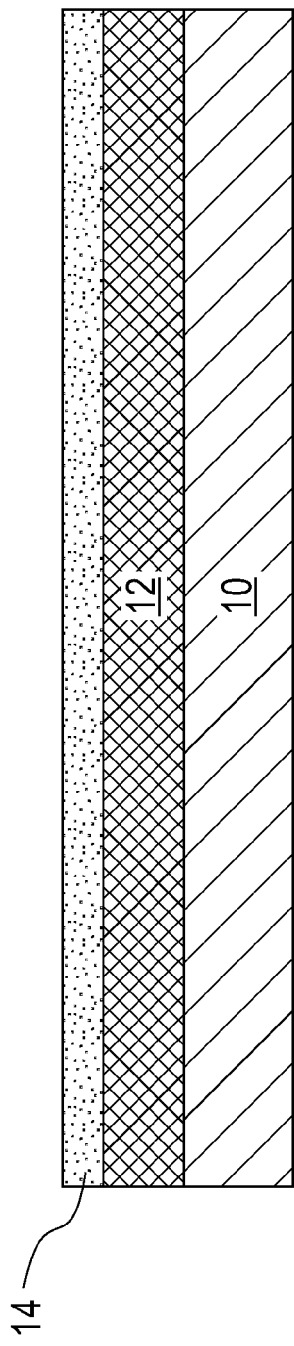
FIG. 1 is a cross sectional view of an exemplary semiconductor structure including a semiconductor-on-insulator substrate that contains a handle substrate, an insulator layer and a channel material layer composed of a III-V compound semiconductor material that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated FIG. 1 an exemplary semiconductor structure that can be employed in accordance with an embodiment of the present application. Notably, the exemplary semiconductor structure shown in FIG. 1 includes a semiconductor-on-insulator substrate that contains a handle substrate 10, an insulator layer 12 and a channel material layer 14 composed of a III-V compound semiconductor material. The handle substrate 10 provides mechanical support for the insulator layer 12 and the channel material layer 14.

In one embodiment, the handle substrate 10 may comprise any semiconductor material having semiconductor properties. Examples of semiconductor materials that may be used as the handle substrate 10 include, but are not limited to, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate 10. In some embodiments, the semiconductor material that provides the handle substrate 10 may have any crystal orientation known to those skilled in the art including, for example, {100}, {110}, or {111}. The handle substrate 10 may be a single crystalline semiconductor material, a polycrystalline material, or an amorphous material.

In some embodiments, the handle substrate 10 is a non-semiconductor material including, for example, a dielectric material and/or a conductive material. In yet other embodiments, the handle substrate 10 can be omitted and a substrate including the insulator layer 12 and the topmost layer 14 can be used.

The insulator layer 12, which in some embodiments may be referred to as a buried insulator layer, may be a crystalline, or non-crystalline, oxide or nitride. In one embodiment, the insulator layer 12 is an oxide such as, for example, silicon dioxide.

The III-V compound semiconductor material that provides the channel material layer 14 includes at least one element from Group III (IUPAC Group 13) of the Period Table of Elements, and at least one element from Group V (IUPAC Group 15) of the Periodic Table of Elements. The range of possible formulae is quite broad because these elements can form binary (two elements, e.g., gallium arsenide (GaAs)), ternary (three elements, e.g., indium gallium arsenide (InGaAs)) and quaternary (four elements, e.g., aluminum gallium indium phosphide (AlInGaP)) alloys. Typically, the channel material layer 14 is a single crystalline III-V compound semiconductor material. The channel material layer 14 may be undoped or doped with a p-type or n-type dopant. The term "p-type" refers to dopants which when added to an intrinsic semiconductor material create deficiencies of valence electrons. The term "n-type" denotes dopants which when added to an intrinsic semiconductor material contribute free electrons. In some embodiments, doping of the III-V compound semiconductor material may be performed after the active regions have been defined. In such an embodiment, the dopants can be introduced into the III-V compound semiconductor material within the active region utilizing one of gas phase doping or ion implantation.

In some embodiments of the present application, the channel material layer 14 can have a thickness from 10 nm to 100 nm. In yet other embodiments, the channel material 14 can have a thickness that is less than 10 nm. The insulator layer 12 may have a thickness from 1 nm to 200 nm. Other thicknesses that are lesser than, or greater than, the aforementioned thickness range can also be employed as the insulator layer 12. The thickness of the handle substrate 10 is inconsequential to the present application.

The semiconductor-on-insulator substrate shown in FIG. 1 can be formed utilizing a layer transfer process. The layer transfer process may include bonding a first wafer containing the handle substrate 10 and the insulator layer 12 to a second wafer containing the channel material layer 14. In some embodiments, and after wafer bonding, an optional thinning step may be performed to thin the channel material layer 14 to a predetermined thickness that is more desirable for certain device applications, and within one of the ranges mentioned above.

In some embodiments of the present application (not shown), a bulk semiconductor substrate can be used in place of the semiconductor-on-insulator substrate shown in FIG. 1. By "bulk semiconductor substrate" it is meant a semiconductor material that is entirely composed of at least one semiconductor material. In one embodiment, the entirety of the bulk semiconductor substrate is composed of a single III-V compound semiconductor. In such an embodiment, an upper portion of the bulk semiconductor substrate can be used as the channel material layer 14. In another embodiment of the present application, the bulk semiconductor substrate includes the channel material layer 14 defined above and at least one other semiconductor material. In one example, a bulk semiconductor substrate containing the channel material layer 14 and a silicon layer or another III-V compound semiconductor material that has a different composition than the channel material layer 14 can be used.

Figure 2:
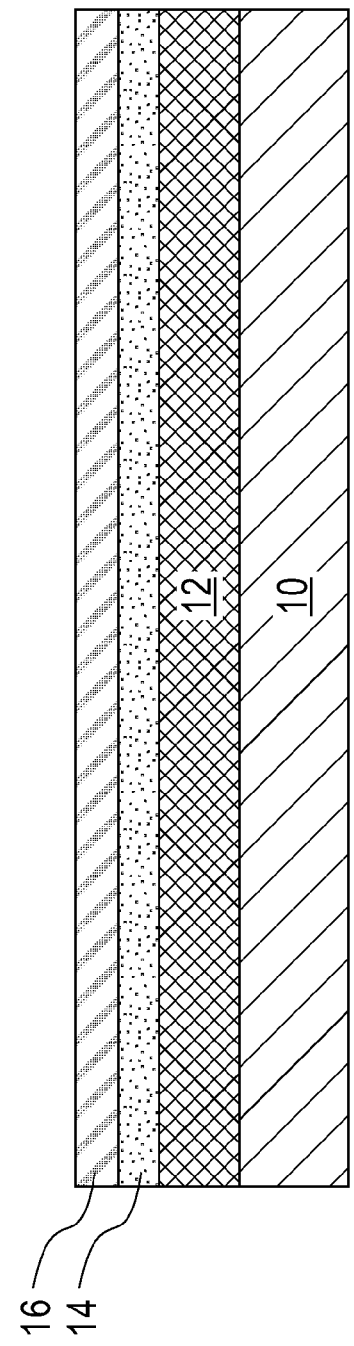
FIG. 2 is a cross sectional view of the exemplary semiconductor structure of FIG. 1 after forming a hard mask material layer on an exposed surface of the channel material layer.

Referring now to FIG. 2, there is illustrated the exemplary semiconductor structure of FIG. 1 after forming a hard mask material layer 16 on an exposed surface of the channel material layer 14. The hard mask material layer 16 is a continuous layer that covers an entirety of the channel material layer 14. The hard mask material layer 16 that can be employed in the present application may include any hard mask material including, for example, a dielectric oxide, a dielectric nitride and/or a dielectric oxynitride. In one embodiment, the hard mask material that can be used in providing the hard mask material layer 16 can be composed of silicon dioxide. In another embodiment, the hard mask material that can be used in providing the hard mask material layer 16 can be composed of silicon nitride. In yet another embodiment, the hard mask material that can be used in providing the hard mask material layer 16 can be a stack of, in any order, silicon dioxide and silicon nitride.

In some embodiments of the present application, the hard mask material that can be used in providing the hard mask material layer 16 can be formed by a deposition process such as, for example, chemical vapor deposition (CVD) or plasma enhanced chemical vapor deposition (PECVD). In other embodiments, the hard mask material that can be used in providing the hard mask material layer 16 can be formed by a thermal process such as, for example, thermal oxidation and/or thermal nitridation. In yet other embodiments, the hard mask material that can be used in providing the hard mask material layer 16 can be formed by a combination of a deposition process and a thermal process. The thickness of the hard mask material that can be used in providing the hard mask material layer 16 can range from 5 nm to 50 nm, although other thicknesses that are lesser than or greater than the aforementioned thickness range can be used for the hard mask material layer 16.

Figure 3:
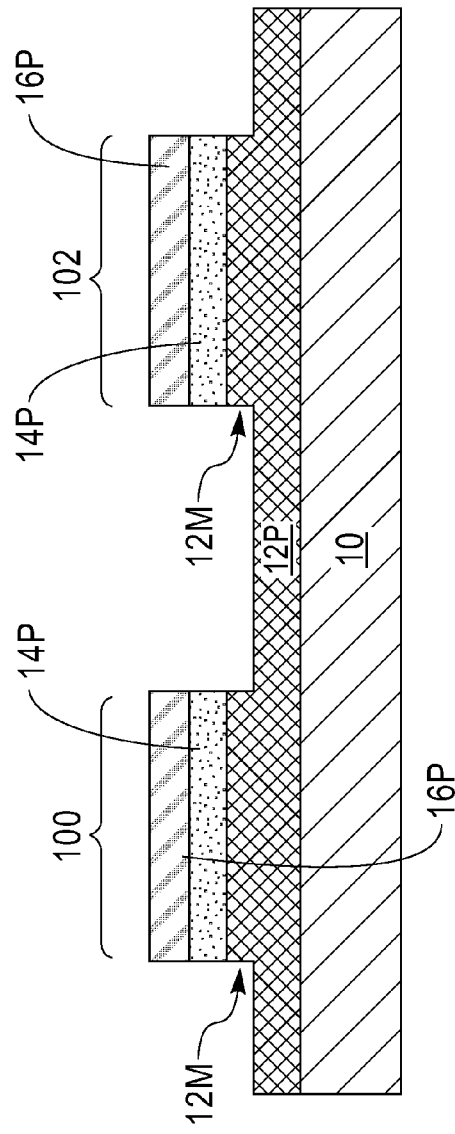
FIG. 3 is a cross sectional view of the exemplary semiconductor structure of FIG. 2 after performing a patterning process to define at least one active area, each active area including a material stack of a mesa portion of the insulator layer, a remaining portion of the channel material layer (i.e., a channel material portion) and a remaining portion of the hard mask layer (i.e., a hard mask material portion).

Referring now to FIG. 3, there is illustrated the exemplary semiconductor structure of FIG. 2 after performing a patterning process to define at least one active area. In the illustrated embodiment of the present application, each active area includes a material stack of a mesa portion 12M of the insulator layer 12, a remaining portion of the channel material layer (i.e., a channel material portion 14P) and a remaining portion of the hard mask layer (i.e., a hard mask material portion 16P). The mesa portion 12M represents a raised portion of a remaining portion of the insulator layer (i.e., insulator layer portion 12P). In some embodiment, the mesa portion 12M may represent a remaining portion of a bulk III-V compound semiconductor material, or another semiconductor material as defined above. As is shown, the sidewall surfaces of the mesa portion 12M, the III-V channel material portion 14P and the hard mask material portion 16P are vertically aligned with each other.

In the present application, and by way of one example, two active regions 100, 102 can be formed. The two active regions 100, 102 may represent regions in which different conductivity type field effect transistors can be formed. In one embodiment, active region 100 may be a region in which a p-type field effect transistor can be subsequently formed, while active region 102 may be a region in which an n-type field effect transistor can be subsequently formed. In another embodiment, active region 100 may be a region in which an n-type field effect transistor can be subsequently formed, while active region 102 may be a region in which a p-type field effect transistor can be subsequently formed.

In one embodiment of the present application, the patterning may be performed by lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In one embodiment the present application, the etch stops within a portion of the insulator layer 12.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer which can be composed of any material that has a different etch selectivity than the mandrel material can be formed by deposition of a spacer material and then etching the deposited spacer material. In one example, the spacer material may be composed of any dielectric spacer material such as, for example, silicon dioxide, silicon nitride or a dielectric metal oxide. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching. After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet another embodiment, the patterning process may include a direct self-assembly (DSA) patterning process.

In some embodiments, the material stacks provided by the patterning process are fin material stacks in which each channel material portion 14P constitutes a semiconductor fin which can be employed in providing a non-planar field effect transistor (i.e., a FinFET). As used herein, a "fin" refers to a contiguous semiconductor material (i.e., the channel material portion), and including a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin may have a width from 4 nm to 30 nm; the height of each semiconductor fin may be from 10 nm to 150 nm. Other widths and heights that are lesser than, or greater than the ranges mentioned herein can also be used in the present application.

In other embodiments, each material stack provided by the patterning process represents a region in which a planar field effect transistor can be subsequently formed on a topmost surface of each channel material portion 14P.

Figure 4:
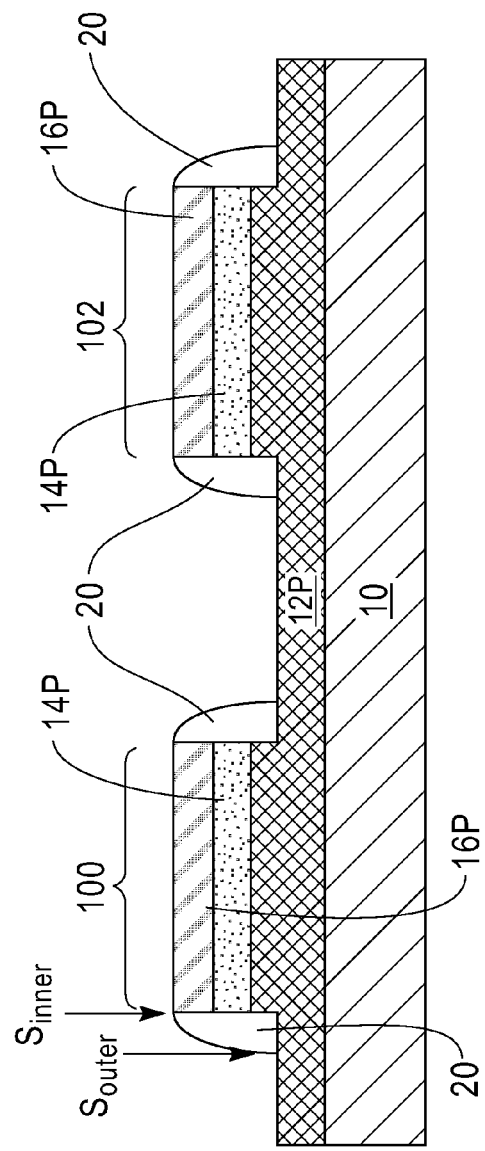
FIG. 4 is a cross sectional view of the exemplary semiconductor structure of FIG. 3 after forming a dielectric spacer on exposed sidewall surfaces of each material stack.

Referring now to FIG. 4, there is illustrated the exemplary semiconductor structure of FIG. 3 after forming a dielectric spacer 20 on exposed sidewall surfaces of each material stack (i.e., mesa portion 12M, channel material portion 14P, and hard mask material portion 16P). In the illustrated embodiment of the present application, each dielectric spacer 20 has a base, i.e., bottommost surface that is present upon a recessed surface of the insulator layer portion 12P.

The dielectric spacer 20 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the dielectric spacer 20 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

Each dielectric spacer 20 that is formed has a width that ensures that within lithographic overlay tolerance a reliable isolation structure can be subsequently formed. In one embodiment of the present application, each dielectric spacer 20 has a width from 25 nm to 100 nm. The width in measured from the outermost sidewall surface, $S_{outer}$, to the innermost sidewall surface, $S_{inner}$, of each dielectric spacer 20.

Figure 5:
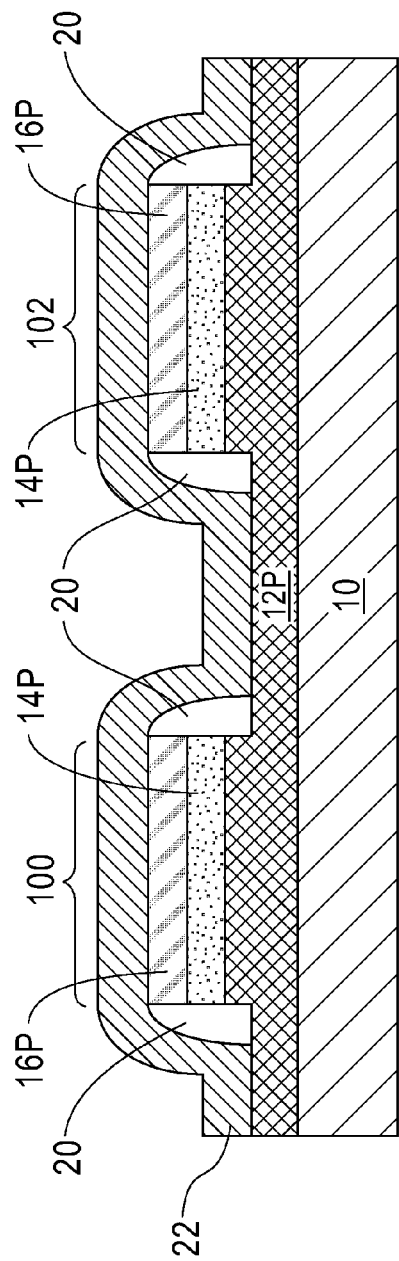
FIG. 5 is a cross sectional view of the exemplary semiconductor structure of FIG. 4 after forming an isolation dielectric material layer.

Referring now to FIG. 5, there is illustrated the exemplary semiconductor structure of FIG. 4 after forming an isolation dielectric material layer 22. At this stage of the present application, the isolation dielectric material layer 22 is formed over exposed recessed surfaces of the isolation layer portion 12P, along sidewalls and a topmost surface of the dielectric spacers 20, and atop each material stack. The isolation dielectric material layer 22 is a conformal layer that covers the entirety of the exemplary semiconductor structure shown in FIG. 4. The term "conformal" denotes that the vertical thickness of a material layer atop horizontal surfaces is substantially the same (100% or less than a factor of two) as the lateral thickness (i.e., width) of the same material layer along sidewall surfaces.

The isolation dielectric material layer 22 may be composed of any dielectric material which may or may not differ from the composition of the dielectric spacer 20, and that can serve to electrically isolate one field effect transistor from another field effect transistor. The isolation dielectric material layer 22 is however composed of a different dielectric material than the hard mask material layer 16. In one embodiment of the present application, the isolation dielectric material layer 22 is composed of silicon dioxide. In other embodiments of the present application, the isolation dielectric material layer 22 may be composed of silicon nitride or silicon oxynitride. The isolation dielectric material layer 22 may be composed of a single dielectric material, or it may be composed of at least two different dielectric materials.

The isolation dielectric material layer 22 may be formed by a deposition process such as, for example, chemical vapor deposition (CVD), plasma enhanced chemical vapor deposition (PECVD) or physical vapor deposition (PVD). The isolation dielectric material layer 22 may have a thickness from 10 nm to 50 nm. Other thicknesses that are lesser than or greater than the aforementioned thickness range can also be used in the present application such that the thickness of the isolation dielectric material layer 22 is sufficient to provide device isolation.

Figure 6:
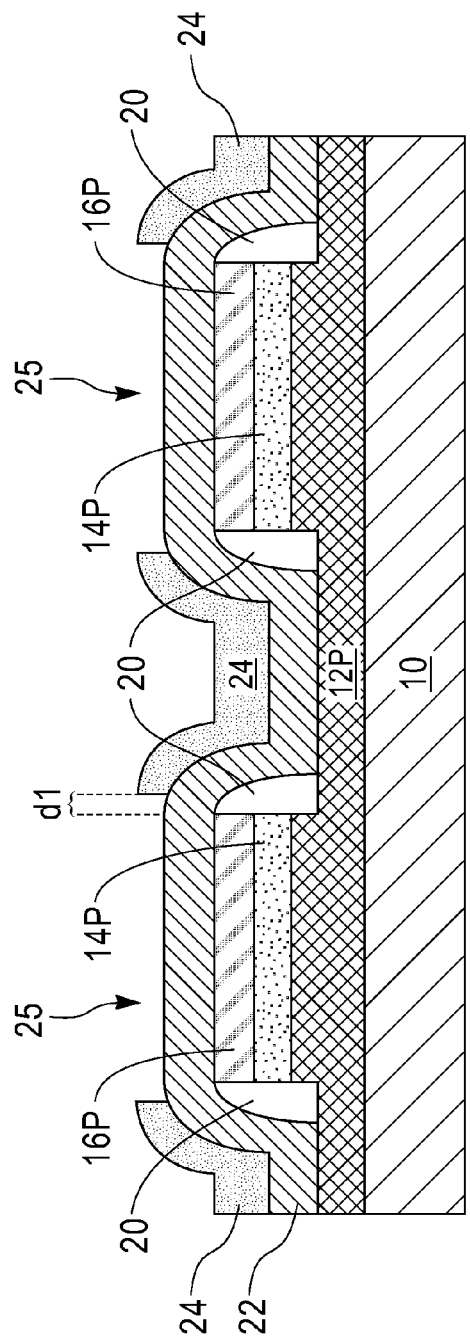
FIG. 6 is a cross sectional view of the exemplary semiconductor structure of FIG. 5 after forming a patterned photoresist on portions of the isolation dielectric material layer, the patterned photoresist containing an opening that exposed a portion of the isolation dielectric material layer located above each dielectric spacer and each material stack.

Referring now to FIG. 6, there is illustrated the exemplary semiconductor structure of FIG. 5 after forming a patterned photoresist 24 on portions of the isolation dielectric material layer 22, the patterned photoresist 24 containing an opening 25 that exposes a portion of the isolation dielectric material layer 22 located above each dielectric spacer 20 and each material stack (i.e., mesa portion 12M, channel material portion 14P, and hard mask material portion 16P).

The opening 25 within the patterned photoresist 24 has a width that is greater than a width of the material stack (12M, 14P, 16P), but less than the combined width of the material stack (12M, 14P, 16P) and the dielectric spacer 20 that is present on each sidewall of the material stack (12M, 14P, 16P). As such, the sidewall edges of each patterned photoresist 24 within each opening 25 are located above a portion of an underlying dielectric spacer 20. In FIG. 6, d1 represents the distance between one of the sidewall edges of the patterned photoresist 24 within opening 25 and one of the sidewall edges of the material stack (12M, 4P, 16P) and dielectric spacer 20. In the present application, d1 can be from 25 nm to 50 nm.

The patterned photoresist 24 can be formed by first forming a photoresist material on the isolation dielectric material layer 22. The photoresist material that provides the patterned photoresist 24 may be a negative-tone photoresist, a positive-tone photoresist, or a hybrid-tone photoresist. The photoresist material that provides the patterned photoresist 24 may be formed utilizing a deposition process such as, for example, spin-on coating. After forming the photoresist material, the photoresist material can be patterned by exposing the photoresist material to a pattern of irradiation and thereafter developing the resist material utilizing any conventional resist developer.

Referring now to FIG. 7, there is illustrated the exemplary semiconductor structure of FIG. 6 after performing an etch. As is shown, the etch removes exposed portions of the isolation dielectric material layer 22 and a topmost portion of each dielectric spacer 20. Each remaining portion of isolation dielectric material layer 22 that is located beneath a portion of the patterned photoresist 24 can be referred to herein as an isolation structure 22S. Each remaining portion of the dielectric spacer 20 can be referred to herein as a dielectric spacer structure 20S; each dielectric spacer structure 20S has a same width (defined from the outermost sidewall surface, $S_{outer}$, to the innermost sidewall surface, $S_{inner}$) as the dielectric spacer 20). As is shown in FIG. 7, the etch forms a gap 26 having the dimensional d1 located above each dielectric spacer structure 20S and between an upper portion of each material stack and a neighboring isolation structure 22S.

In one embodiment of the present application, a reactive ion etch may be used to provide the exemplary semiconductor structure shown in FIG. 7. In other embodiments, other anisotropic etching processes besides a reactive ion etch may be employed.

Referring now to FIG. 8, there is illustrated the exemplary semiconductor structure of FIG. 7 after removing the patterned photoresist 24. The patterned photoresist 24 may be removed utilizing a conventional resist stripping process such as, for example, ashing.

Figure 9:
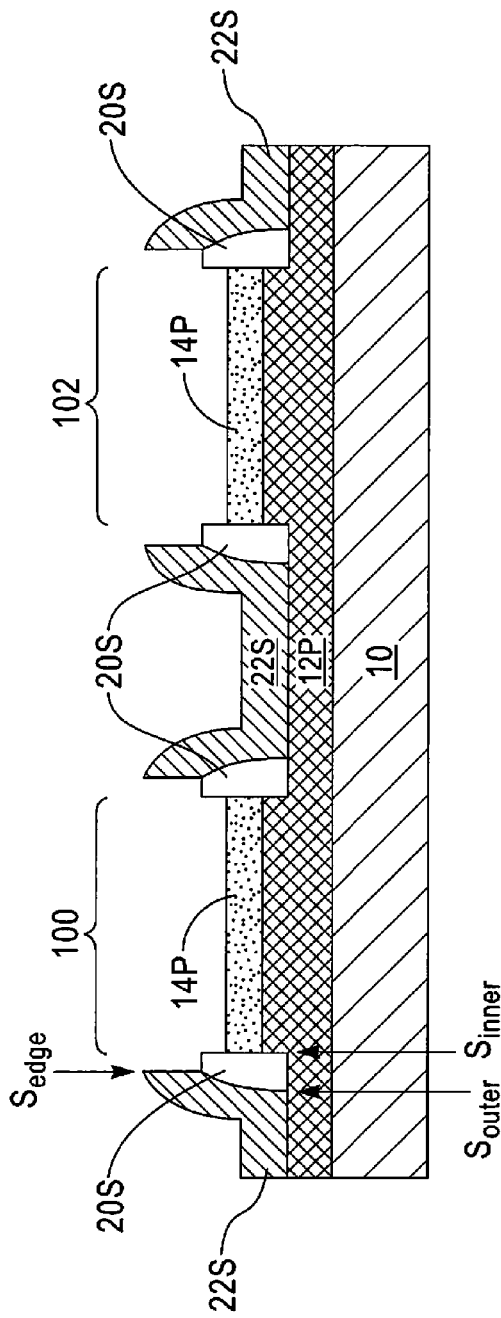
FIG. 9 is a cross sectional view of the exemplary semiconductor structure of FIG. 8 after removing each hard mask material portion.

Referring now to FIG. 9, there is illustrated the exemplary semiconductor structure of FIG. 8 after removing each hard mask material portion 16P to expose a topmost surface of each channel material portion 14P in each device region 100, 102. Each hard mask portion 16P can be removed utilizing an etch that is selective in removing the hard mask material that provides each hard mask portion 16P.

FIG. 9 (together with FIG. 10) shows one example of the exemplary semiconductor structure of the present application. As shown, the exemplary semiconductor structure includes a channel material portion 14P composed of a III-V compound semiconductor located on a mesa portion 12M of a substrate (12P, 10). The structure further includes a dielectric spacer structure 20S located on each sidewall surface of the channel material portion 14P and each sidewall surface of the mesa portion 12M of the substrate (12P, 10). As can be seen, the dielectric spacer structure 20 has a height that is greater than a height of the channel material portion 14P. The structure further includes an isolation structure 22S located on each dielectric spacer structure 20S, wherein a sidewall edge, $S_{edge}$, of the isolation structure 22S is located between an innermost sidewall surface, $S_{inner}$, and an outermost sidewall surface, $S_{outer}$, of the dielectric spacer structure 20S. It is noted that the isolation structure 22S is not formed utilizing a high temperature thermal oxidation process or utilizing a chemical mechanical planarization process.

In the present application and as shown in FIG. 9, a bottommost surface of the isolation structure 22S is coplanar with a bottommost surface of the dielectric spacer structure 20S. Also, the bottommost surfaces of the isolation structure 22S and the dielectric spacer structure 20S are located on a non-recessed portion of the substrate (i.e., insulator layer portion 12P). As can be deduced from the drawing, a first width between each dielectric spacer 20S located on each sidewall surface of the channel material portion 14P is less than a second width between the sidewall edges of each isolation structure 22S.

Figure 10:
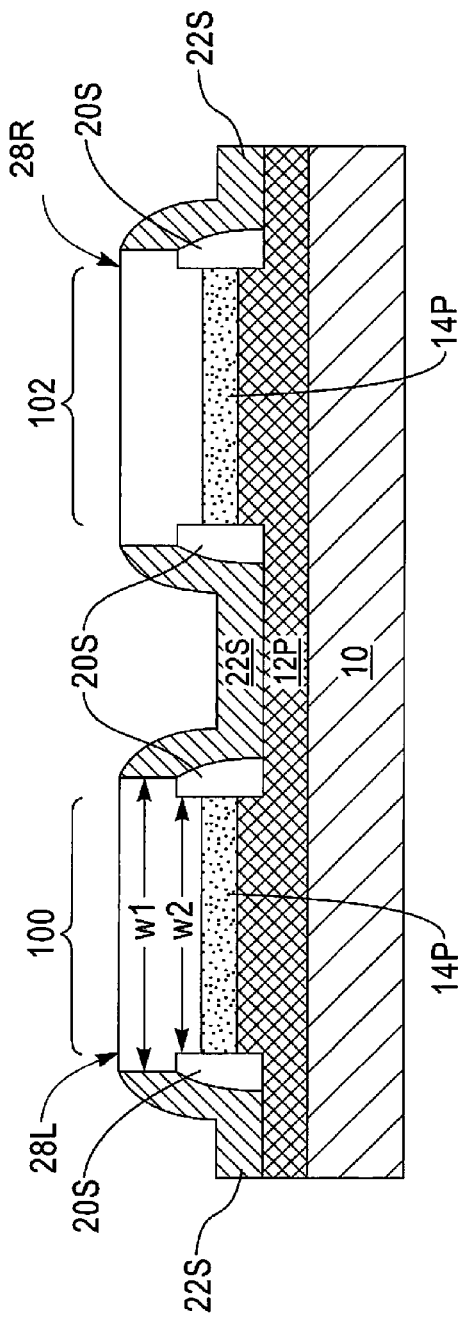
FIG. 10 is a cross sectional view of the exemplary semiconductor structure of FIG. 9 after forming a functional gate structure.

Referring now to FIG. 10, there is illustrated the exemplary semiconductor structure of FIG. 9 after forming a functional gate structure. In the drawings, a functional gate structure 28L is formed in the first device region 100, while another functional gate structure 28R is formed in the second device region 102. Each functional gate structure that is formed has an upper portion having a first width, w1, and a lower portion having a second width, w2, wherein the first width is greater than the second width. As is shown, w1 is bounded by a portion of the sidewall edges of each isolation structure 22S, while w2 is bounded by an upper portion of the inner sidewall surfaces, $S_{inner}$, of each dielectric spacer structure 20S.

By "functional gate structure" it is meant a permanent gate structure used to control output current (i.e., flow of carriers in the channel) of a semiconducting device through electrical or magnetic fields. Each functional gate structure that is formed includes a gate material stack (not shown) of, from bottom to top, a gate dielectric portion and a gate conductor portion. In some embodiments, a gate cap portion (also not shown) can be present atop the gate conductor portion.

Each gate dielectric portion comprises a gate dielectric material. The gate dielectric material that provides the gate dielectric portion can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion.

The gate dielectric material used in providing the gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion comprises a same gate dielectric material. In other embodiments and when multiple functional gate structures are formed, some of the gate dielectric portions may comprise a first gate dielectric material, while other gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion can have a thickness in a range from 1 nm to 10 nm. Other thicknesses that are lesser than, or greater than, the aforementioned thickness range can also be employed for the gate dielectric material.

Each gate conductor portion comprises a gate conductor material. The gate conductor material used in providing the gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion may comprise an nFET gate metal. In other embodiments, the gate conductor portion may comprise a pFET gate metal. In yet other embodiments and when multiple functional gate structures are formed, some of the gate conductor portions comprise an nFET gate metal, while others gate conductor portions comprise a pFET gate metal.

The gate conductor material used in providing the gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion has a thickness from 1 nm to 100 nm. Other thicknesses that are lesser than, or greater than, the aforementioned thickness range can also be employed for the gate conductor material used in providing the gate conductor portion.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, at least one sacrificial gate structure is formed first and then replaced with a functional gate structure. By "sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion. The sacrificial gate material portion includes one of the gate conductor materials mentioned above for gate conductor portion. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

As is shown in FIG. 10, a topmost surface of each functional gate structure 28L, 28R is coplanar with a topmost surface of the isolation structure 22S. As is further shown in FIG. 10, each functional gate structure contacts a topmost surface and an upper portion of the innermost sidewall surface of the dielectric spacer structure 20S, and the sidewall edge of the isolation structure 22S.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
  a channel material portion composed of a III-V compound semiconductor located on a mesa portion of a substrate;
  a dielectric spacer structure located on each sidewall surface of the channel material portion and each sidewall surface of said mesa portion of said substrate, said dielectric spacer structure having a height that is greater than a height of said channel material portion;
  an isolation structure located on each dielectric spacer structure, wherein a sidewall edge of said isolation structure is located between an innermost sidewall surface and an outermost sidewall surface of said dielectric spacer structure, and a first width between each dielectric spacer structure located on each sidewall surface of said channel material portion is less than a second width between said sidewall edges of each isolation structure; and
  a functional gate structure located in an area defined by said first and second widths and present on said channel material portion, wherein a topmost surface of said functional gate structure is coplanar with a topmost surface of said isolation structure.

2. The semiconductor structure of claim 1, wherein a bottommost surface of said isolation structure is coplanar with a bottommost surface of said dielectric spacer structure.

3. The semiconductor structure of claim 2, wherein said bottommost surfaces of said isolation structure and said dielectric spacer structure are located on a non-recessed portion of said substrate.

4. The semiconductor structure of claim 1, wherein said mesa portion comprises an insulator material.

5. The semiconductor structure of claim 1, wherein said functional gate structure contacts a topmost surface and an upper portion of said innermost sidewall surface of said dielectric spacer structure, and said sidewall edge of said isolation structure.

6. The semiconductor structure of claim 1, wherein said channel material portion is a III-V semiconductor fin.

7. The semiconductor structure of claim 1, wherein said substrate includes an insulator layer and a handle substrate, and wherein said mesa portion of said substrate comprises a portion of said insulator layer.

8. A method of forming a semiconductor structure, said method comprising:
  forming at least one active area on a surface of a substrate, each active area comprising a material stack of a mesa portion of said substrate, a channel material portion of a III-V compound semiconductor material, and a hard mask material portion;
  forming a dielectric spacer on each exposed sidewall surface of said material stack;
  forming an isolation dielectric material layer on said dielectric spacer and on said at least one active area;
  patterning said isolation dielectric material layer and said dielectric spacer by providing a patterned photoresist on said isolation dielectric material layer, said patterned photoresist having an opening located above said material stack and a portion of each dielectric spacer, removing exposed portions of said isolation dielectric material layer and underlying portions of said dielectric spacer by etching, and removing said patterned photoresist, wherein a remaining portion of said isolation dielectric material layer forms an isolation structure on a remaining portion of said dielectric spacer, and wherein a sidewall edge of said isolation structure is located between an innermost sidewall surface and an outermost sidewall surface of said remaining portion of said dielectric spacer; and removing said hard mask material portion.

9. The method of claim 8, wherein said forming said at least one active region comprises:

providing a semiconductor-on-insulator comprising, from bottom to top, a handle substrate, an insulator layer, and a channel material layer composed of said III-V compound semiconductor material;

forming a hard mask material layer on said channel material layer; and patterning said hard mask material layer, said channel material layer and an upper portion of said insulator layer.

10. The method of claim 8, wherein said removing said hard mask material portions comprises an etch.

11. The method of claim 8, wherein said forming said isolation dielectric material layer comprises a deposition process.

12. The method of claim 8, wherein a bottommost surface of a remaining portion of said dielectric spacer and said isolation structure are coplanar with each another.

13. The method of claim 8, wherein a first width between each remaining portion of said dielectric spacer located on each sidewall surface of said channel material portion is less than a second width between said sidewall edges of each isolation structure.

14. The method of claim 13, further comprising forming a functional gate structure in an area defined by said first and second widths and present on said channel material portion.

15. The method of claim 14, wherein a topmost surface of said functional gate structure is coplanar with a topmost surface of said isolation structure.

16. The method of claim 15, wherein said functional gate structure contacts a topmost surface and an upper portion of said innermost sidewall surface of said dielectric spacer structure, and said sidewall edge of said isolation structure.

* * * * *